(12) United States Patent
Lin et al.

(10) Patent No.: US 6,194,285 B1
(45) Date of Patent: Feb. 27, 2001

(54) FORMATION OF SHALLOW TRENCH ISOLATION (STI)

(75) Inventors: Chung-Te Lin, Tainan; Kong-Bong Thei; Carlos H. Diaz, both of Shin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/412,653

(22) Filed: Oct. 4, 1999

(51) Int. Cl.⁷ .................................................. H01L 21/76
(52) U.S. Cl. ........................ 438/424; 438/435; 438/437
(58) Field of Search ................................... 438/424, 435, 438/437

(56) References Cited

U.S. PATENT DOCUMENTS

| | | | |
|---|---|---|---|
| 4,760,034 | 7/1988 | Barden | 437/47 |
| 4,897,364 | 1/1990 | Nguyen et al. | 437/69 |
| 5,395,790 | 3/1995 | Lur | 437/69 |
| 5,521,422 | 5/1996 | Mandelman et al. | 257/510 |
| 5,652,162 | 7/1997 | Liao | 437/45 |
| 5,923,993 * | 7/1999 | Sahota | 438/427 |
| 5,961,373 * | 10/1999 | Lai et al. | 451/41 |
| 6,004,863 * | 12/1999 | Jang | 438/427 |
| 6,015,757 * | 1/2000 | Tsai et al. | 438/697 |
| 6,033,970 * | 3/2000 | Park | 438/435 |
| 6,043,133 * | 3/2000 | Jang et al. | 438/401 |
| 6,051,496 * | 4/2000 | Jang | 438/687 |
| 6,071,792 * | 6/2000 | Kim et al. | 438/424 |
| 6,093,656 * | 7/2000 | Lin | 438/734 |
| 6,124,183 * | 9/2000 | Karlson et al. | 438/427 |
| 6,136,713 * | 10/2000 | Chen et al. | 438/692 |

* cited by examiner

*Primary Examiner*—Long Pham
(74) *Attorney, Agent, or Firm*—George O. Saile; Stephen B. Ackerman

(57) ABSTRACT

A method is disclosed to form a shallow trench isolation (STI) having reduced junction leakage by avoiding undercutting near the shoulder of the trench. This is accomplished by using the pad oxide as a screen oxide and not removing it by wet dip etch as is normally practiced. Instead, an extra layer of low temperature oxide is added through thermal growth, and then the resulting composite is removed together with minimal undercutting at the shoulder corners of the trench. Subsequently, gate oxide is grown thermally to complete the forming of the STI.

33 Claims, 6 Drawing Sheets

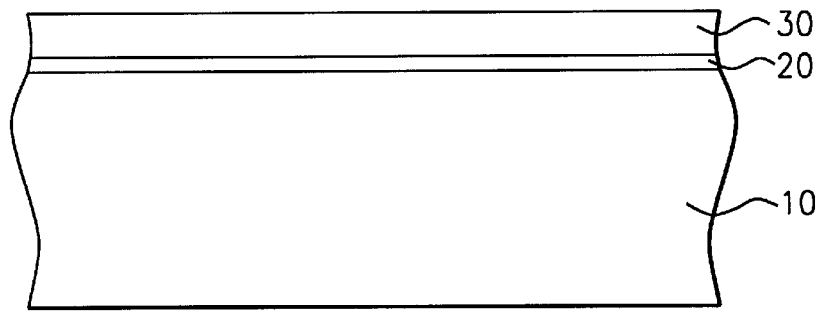
FIG. 1a – Prior Art
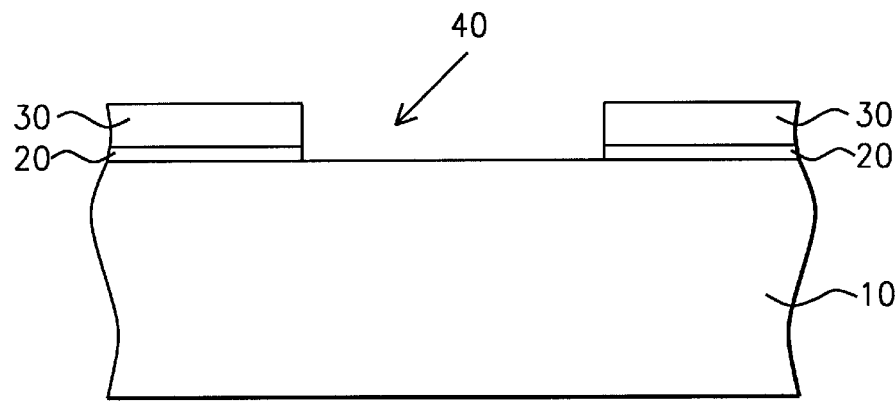
FIG. 1b – Prior Art
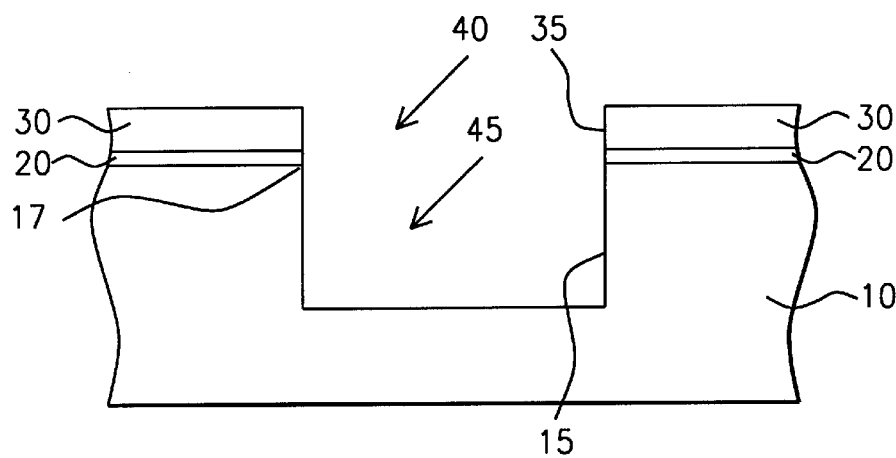
FIG. 1c – Prior Art

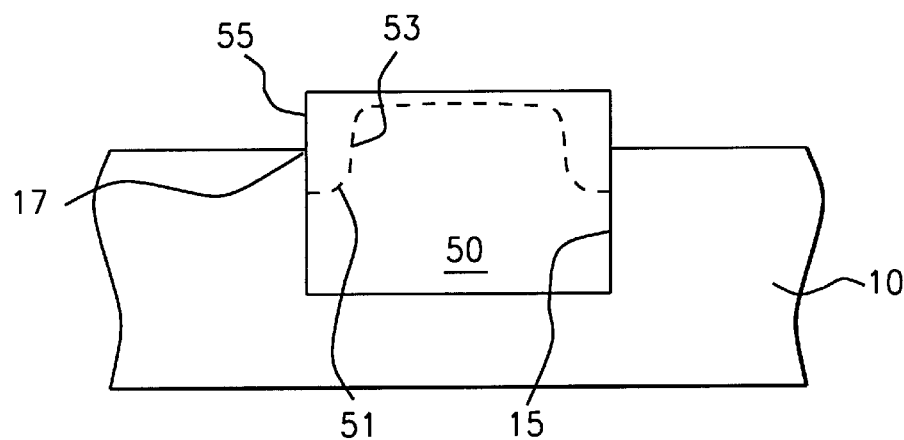
FIG. 1d — Prior Art
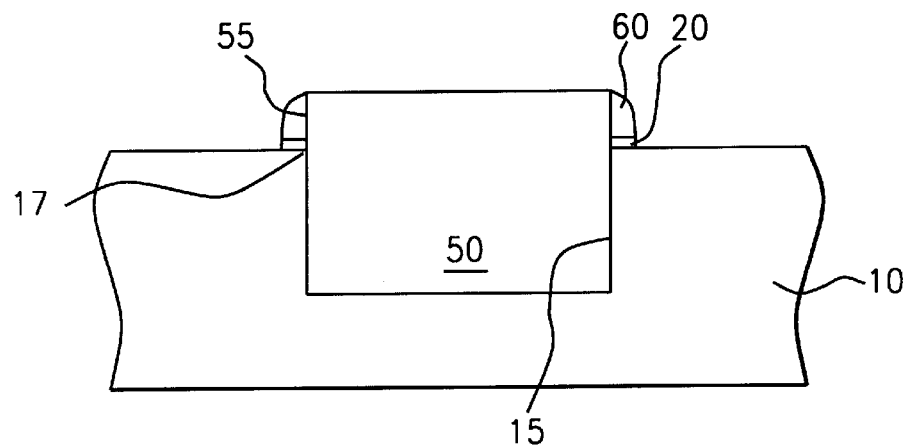
FIG. 1e — Prior Art
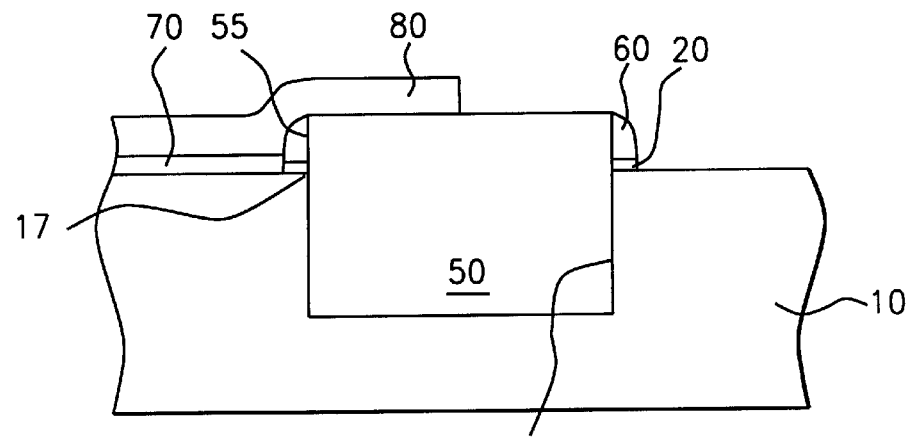
FIG. 1f — Prior Art

FORMATION OF SHALLOW TRENCH ISOLATION (STI)

BACKGROUND OF THE INVENTION

(1) Field of the Invention

The present invention relates to semiconductor devices in general, and more particularly, to a method of forming shallow trench isolation without corner leakage effects.

(2) Description of the Related Art

Trench structures in semiconductors are employed for various purposes, such as for replacement of LOCOS (local oxidation of silicon) isolation for like devices within the same tub in a CMOS device, or for isolation of n-channel from p-channel devices, or as trench-capacitor structures in DRAMS, or for isolation of bipolar devices. Shallow refilled trenches are used primarily for isolating devices of the same type, and trench-capacitor structures are normally fabricated with narrow, deep trenches. By virtue of the shape of a trench, there usually results a sharp corner or shoulder where the trench intersects with the surface within which the trench is formed. Consequently, concentration of the electric-field occurs at the sharp corner region which in turn causes the lowering of the threshold voltage of the corner region, and this part of the device turns on at a lower voltage than does the interior portion of the device. As is known in the art, the problem is exacerbated if there is a downward step in the field oxide adjacent the trench. The larger the step, the lower the threshold voltage, and unwanted subthreshold conduction begins at progressively lower values of the gate voltage. It is disclosed later in the embodiments of this invention a method of eliminating these common but undesirable steps at the trench corners and shoulders.

In prior art, several techniques have been developed to minimize the parasitic leakage caused by the electricfiled concentration at the trench corner. Because the trench corner can be made sharper by successive process steps during manufacturing, one approach is to protect the corner from the effects of subsequent processes.

Mandelman, et al., in U.S. Pat. No. 5,521,422 uses a corner dielectric co-aligned with the trench corner extending a subminimum dimension distance from the corner. The corner dielectric serves as a spacer and is formed as shown in FIGS. 1a–1f. In FIG. 1a, a silicon substrate (10) is provided with pad oxide (20) and nitride surface coating (30). Window (40) with nearly vertical sidewall (35) is photolithographically defined in surface coating (30) and oxide layer (20) as shown in FIG. 1b. Trench (45) is etched, defined by window (40) as illustrated in FIG. 1c. It will be noted that now the intersection of oxide layer (20) and trench (45) forms trench corner (17). Trench (45) and window (40) are then filled with insulator (50). Insulator (50) is then polished, stopping on surface coating (30) (not shown). Then surface coating (30) is removed leaving insulator (50) with nearly vertical sidewalls (55) extending above the surface (13) of silicon substrate (10) as shown in FIG. 1d. It will be known by those skilled in the art that during isotropic etches used in standard semiconductor processing after trench (45) is filled with insulator (50), trench corner (17) becomes exposed. During the commonly used wet-etch process, sidewall (55) retreats to (53) while a groove-like recess (51) is formed, as shown by broken lines in FIG. 1d. In other words, corner (17) becomes sharpened further and hence more susceptible to electric-field concentration. In order to avoid this, Mandelman, et al., provide spacer (60) self-aligned to sidewall (55) of insulator (50) by performing standard process of depositing a spacer insulator having a desired thickness and then directionally etching to selectively remove the spacer insulator from horizontal surfaces as shown in FIG. 1e. Finally, gate dielectric (70) is formed by conventional processing, gate conductor (80) deposited and photolithographically defined. Thus, gate conductor (80) is spaced from corner (17) by corner dielectric (60) and the electric field in the corner region is significantly reduced.

In another approach, Barden in U.S. Pat. No. 4,760,034 discloses a method for forming a DRAM cell having a capacitor adjacent a field effect transistor (FET), wherein the FET fabrication area is protected from adverse effects of the capacitor formation. Barden accomplishes this by forming edge-sealed multi-layer structure while protecting adjacent region by screen oxide layer.

Lur of U.S. Pat. No. 5,395,790, on the other hand, discloses a method of partial trench etching to form at least one narrow trench, followed by anneal-treatment to release stress and eliminate crystalline defects, therein. Isolating material is then filled into the narrow trench to form a complete stress-free isolation layer.

An improved LOCOS device isolation method for forming a field oxide is disclosed by Nguyen, et al., in U.S. Pat. No. 4,897,364. In one embodiment of the invention a silicon substrate is provided having a pad oxide formed on its surface and a first polysilicon stress-relief buffer layer formed overlying the first polysilicon layer. Next, a second polysilicon, etch-resistant buffer layer is deposited overlying the first nitride layer. The first nitride layer and second polysilicon layer are patterned by conventional lithography while the fist polysilicon and pad oxide layers remained unpatterned. A second nitride layer is deposited overlying the patterned second polysilicon layer and exposed regions of the first polysilicon layer. Sidewalls are formed on the edges of the patterned first nitride and second polysilicon layers by anisotropically etching the second nitride layer using the first and second polysilicon layers as etching endpoints. Finally, the field oxide is grown by conventional methods. The grown field oxide exhibits reduced the well-known bird's beak length, and the resulting field separation is not limited by optical lithography resolution.

In still another approach, Liao teaches in U.S. Pat. No. 5,652,162, a method for forming field-oxide regions for a ROM (read-only-memory) cell where channels with concave shapes are formed to increase the effective channel length of the device.

In the present invention, a method is described where the integrity of the trench corner is protected from unwanted process induced alterations by using pad oxide as a screen oxide and by eliminating the wet etching of the trench oxide.

SUMMARY OF THE INVENTION

It is therefore an object of this invention to provide a method of forming a shallow isolation trench (STI) having reduced junction leakage.

It is another object of this invention to provide a method of forming an STI having reduced undercutting at the shoulder of the trench by avoiding wet dip etching.

It is yet another object of this invention to provide a method of forming an STI by employing pad oxide as a screen oxide and low temperature annealing of the substrate surface.

These objects are accomplished by providing a substrate having predetermined active areas and passive regions; forming a pad oxide layer over said substrate; forming a nitride layer over said pad oxide layer; forming an organic BARC layer over said nitride layer; forming a first photoresist layer over said organic BARC layer; patterning said first photoresist layer to form a first photoresist mask defining openings for at least one shallow trench to be formed in said substrate; etching said organic BARC layer, said nitride layer and said pad oxide layer through said openings in said first photoresist mask to expose a portion of said substrate; etching said exposed portion of said substrate to form a shallow trench in said substrate; removing said first photoresist mask; forming a conformal layer of oxide on the inside walls of said shallow trench; filling said shallow trench with isolation oxide; forming a second photoresist layer over said substrate; patterning said second photoresist layer to form a second photoresist mask defining reverse openings corresponding to at least one active area in said substrate; etching said isolation oxide through said reverse openings in said second photoresist mask until said organic BARC layer over said active area is reached; removing said second photoresist mask over said substrate; performing chemical mechanical polishing of said isolation oxide until stopping on said organic BARC layer on said substrate; removing said organic BARC layer and said nitride layer; performing well implanting over said substrate using pad oxide as a screen oxide; growing low temperature oxide to anneal the surface of said substrate; removing said pad oxide and said low temperature oxide; and growing gate oxide layer over said substrate to complete the forming of said STI.

BRIEF DESCRIPTION OF THE DRAWINGS

FIG. 1a is a partial cross section of a semiconductor substrate showing the forming of a pad oxide layer and a nitride layer according to prior art.

FIG. 1b shows the patterning of the pad oxide and nitride layers of FIG. 1a, according to prior art.

FIG. 1c shows the forming of a trench in the substrate of FIG. 1b, according to prior art.

FIG. 1d shows the undercutting of the shoulder or the corners of the trench when etching is performed on the isolation oxide over the trench of FIG. 1c, according to prior art.

FIG. 1e shows the forming of spacers on the substrate of FIG. 1d, according to prior art.

FIG. 1f shows the forming of a gate over the trench of FIG. 1e, according to prior art.

DESCRIPTION OF THE PREFERRED EMBODIMENTS

Figure 2A:
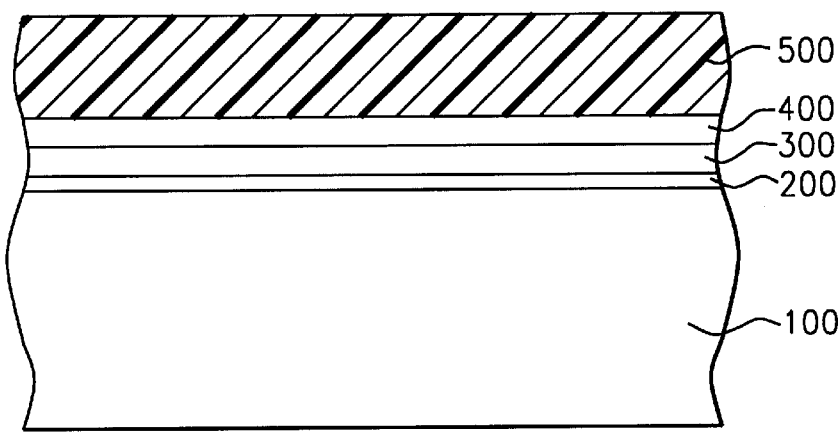
FIG. 2a shows a partial cross section of a semiconductor substrate showing the forming of a photoresist layer over the pad oxide, nitride and BARC layers formed according to the present invention.
Figure 2B:
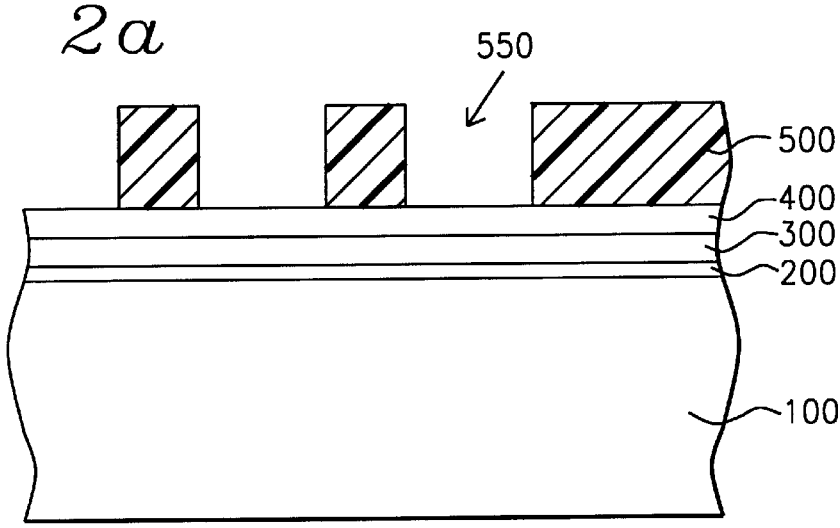
FIG. 2b shows the patterning of the photoresist layer of FIG. 2a according to this invention.

Referring now to the drawings, specifically to FIGS. 2a–2l, there is shown a method of forming a shallow trench isolation (STI) having reduced junction leakage through avoidance of undercutting the shoulders or corners of the trench. As disclosed in the preferred embodiments below, this is accomplished by using a pad oxide as a screen oxide and not removing it by wet dip etch as is normally practiced. Instead, an extra layer of low temperature oxide is added through thermal growth, and then the resulting composite is removed together with minimal undercutting at the corners of the trench. Subsequently, gate oxide is grown thermally to complete the forming of the STI.

More specifically, in FIG. 2a, substrate (100), preferably silicon, is provided having predetermined active areas and passive regions. Prior to forming the trenches in the passive regions according to the present invention, pad oxide layer (200) is first thermally grown over the surface of the substrate preferably at a temperature range between about 850 to 950° C. and to a thickness between about 190 to 210 Å. Alternatively, the pad oxide can be formed by an atmospheric or low pressure chemical vapor deposition (LPCVD) process as is well known.

Next, nitride layer (300) is formed over the pad oxide layer preferably by reacting dichlorosilane ($SiCl_2H_2$) with ammonia ($NH_3$) in an LPCVD at a temperature between about 750 to 800° C. The preferred thickness of nitride layer (300) is between about 1000 to 2000 Å. This is followed by the forming of an organic layer referred to as bottom anti-reflective coating, or BARC. The thickness of BARC is between about 200 to 500 Å. Alternatively, silicon oxynitrides ($SiO_xN_y$) may be preferred as they have the masking properties of nitrides and yet stress relief qualities of an oxide. They are chemical vapor deposited (CVD) by reacting $SiH_4$ with $N_2O$ and $NH_3$.

Figure 2C:
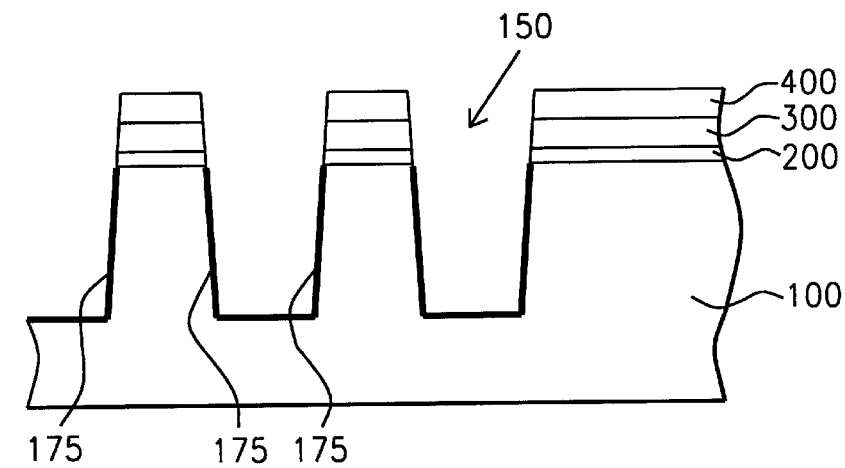
FIG. 2c shows the forming of trenches in the substrate of FIG. 2b, and the lining of the trenches with an oxide growth performed according to this invention.

A first photoresist layer (500) is next formed over the BARC layer and patterned to delineate the predetermined areas of active and passive regions. Thus, in FIG. 2b, patterned openings (550) correspond to areas where trenches are to be formed, while areas that are protected by the photoresist layer are areas where active regions will be formed. The thickness of photoresist layer (500) is between about 0.4 to 0.6 micrometers ($\mu$m). Using patterned layer (500) as a photoresist mask, organic BARC layer (400), nitride layer (300) and pad oxide layer (200) are then dry etched to expose portions of the underlying silicon substrate surface. The etching can be accomplished by using gases $O_2/N_2$. This is followed by etching the silicon substrate to form trench (150) as shown in FIG. 2c. The preferred depth of the trench is between about 3000 to 5000 Å, and is formed by using etch recipe comprising $Cl_2$ and HBr. Then, the inside walls of the trench is lined with oxide grown to a thickness between about 250 to 350 Å. The thermal growth of oxide lining (175) shown in FIG. 2c is accomplished preferably at a temperature between about 1000 to 1100° C.

Figure 2D:
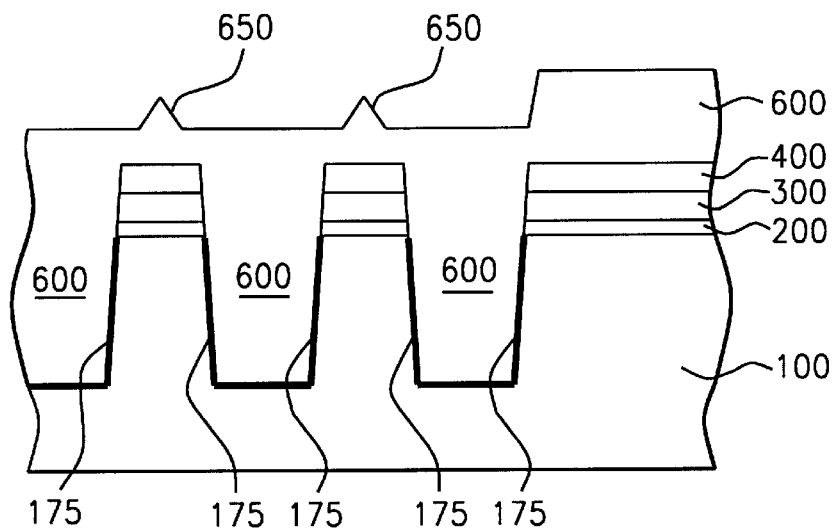
FIG. 2d shows the forming of an isolation oxide over the substrate of FIG. 2c, including the filling of the trenches according to this invention.

After the lining of the trench with an oxide layer, another dielectric material, or isolation oxide is blanket deposited over the substrate, thus filling the trenches as shown in FIG. 2d. Forming dielectrics are known in the art. Blanket dielectric layers may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, isolation oxide (600) shown in FIG. 2d is preferably formed of a dielectric material chosen from the group of dielectric materials consisting of silicon oxide dielectric materials, silicon nitride, and silicon oxynitride. Preferably, the isolation oxide (600) comprises $SiO_2$ formed by employing high-density plasma (HDP) chemical vapor deposition (CVD).

Figure 2E:
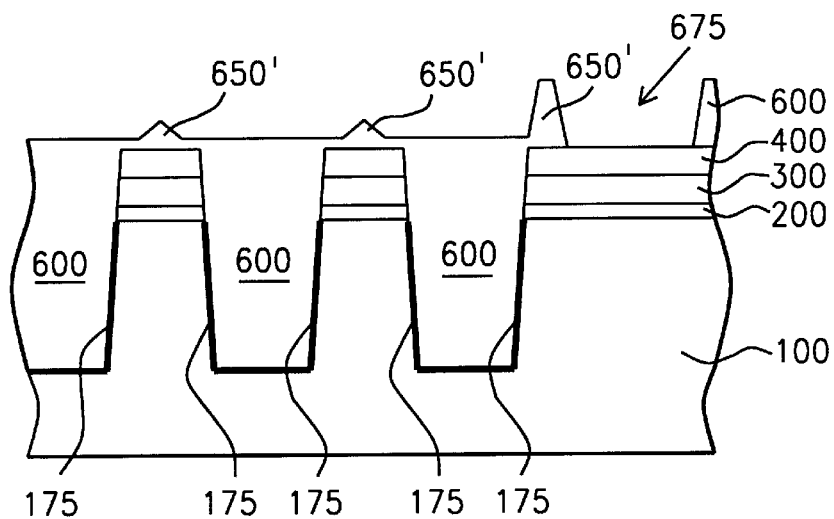
FIG. 2e shows the performing of a reverse etch over the active areas of the present invention.
Figure 2F:
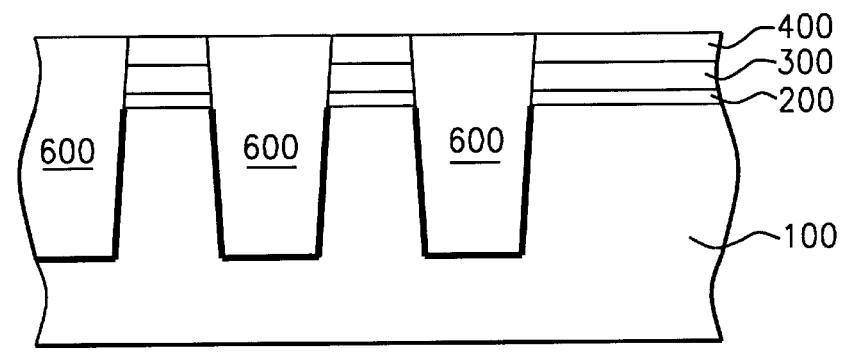
FIG. 2f shows the chemical-mechanical polishing of the isolation oxide over the substrate of FIG. 2e, according to this invention.

It will be noted in FIG. 2d that the isolation oxide layer while generally flat over wide areas, forms peaks (650) over narrow areas. It has been found in the present state of practice in the manufacturing line that when the underlying areas below the isolation oxide are less than about 0.8 μm, peaks (650) do form. When, in the subsequent step, chemical-mechanical polishing (CMP) is performed, the peaks have the tendency of being abraded much faster than the flat areas. This action will then allow the polishing pad to reach down into the trenches as the flat areas are still being polished, and cause the CMP pad to abrade the isolation oxide in the trenches more than in other areas, thus causing dishing (not shown) in the trenches. In order to prevent dishing, it is important that areas over active regions larger than about 0.8 μm be "reverse" etched. That is, a second photoresist layer (not shown) is formed over the substrate, patterned for active areas and a reverse photoresist mask is formed. Then isolation oxide layer (600) is etched until the underlying BARC layer over the active areas are reached. Etching is performed using a recipe having high oxide/SiN selectivity. This will form new peaks (650') as shown in FIG. 2e. Then, performing CMP, the isolation oxide layer is planarized evenly down to BARC layer (400) over the substrate without causing dishing in the trenches, as shown in FIG. 2f.

Figure 2G:
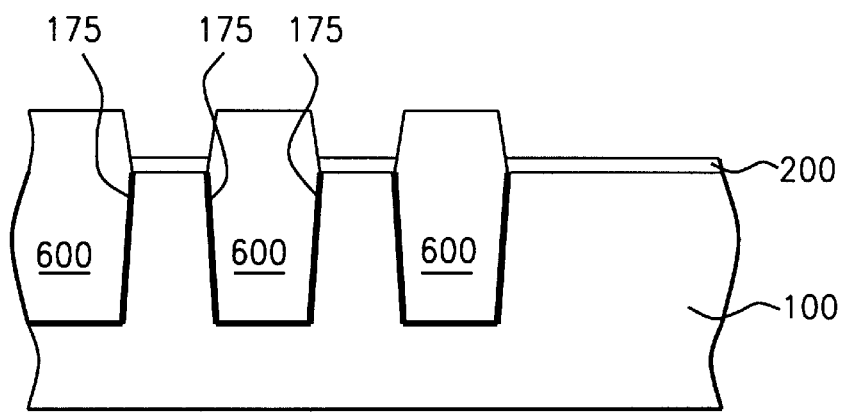
FIG. 2g shows the removal of the BARC layer and the nitride layer from the substrate of FIG. 2f, according to this invention.
Figure 2H:
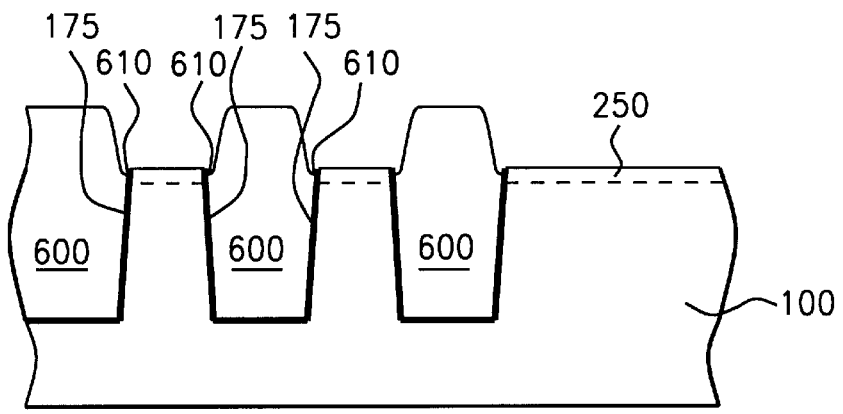
FIG. 2h shows the removal of the pad oxide layer according to the present practice in the manufacturing line, and the resulting undercutting at the corners of the trenches of FIG. 2g.
Figure 2I:
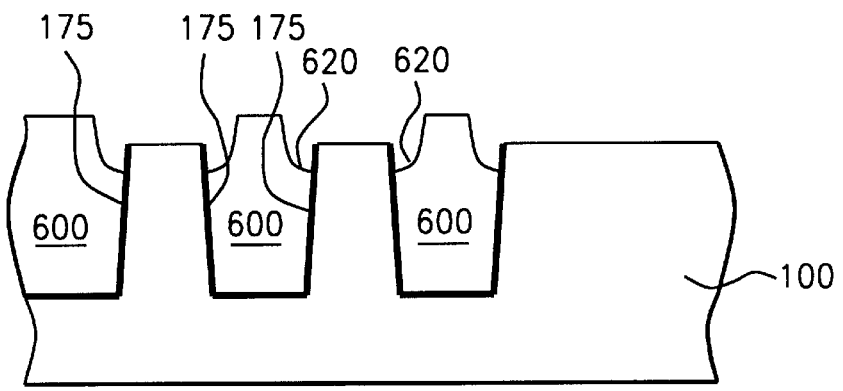
FIG. 2i shows the large undercutting formed at the corners of the trenches during the removal of the sacrificial oxide layer of FIG. 2h as currently practiced in the manufacturing line.

FIGS. 2g–2j show the present practice employed in the manufacturing line in forming trenches. Namely, BARC layer (400), nitride layer (300) are first removed as shown in FIG. 2g. Next, pad oxide layer (200) shown in FIG. 2f is removed using HF (hydrofluoric acid) etch. As it will be known to those skilled in the art, the etch also creates a notch, (610) in FIG. 2h, at the shoulder or corner of the trench. Then, usually a sacrificial oxide layer, (250), is formed to perform as a screen oxide to protect the substrate surface from ion damage during the implanting of tubs or wells (not shown) for the devices to be formed in the substrate. The sacrificial oxide layer is then removed using again another HF etch. However, this causes further removal of isolation oxide at the corner of the trench, thus forming a rather large undercutting (620) as shown in FIG. 2i. Such undercutting can cause junction leakage and the associated undesirable phenomenon known as Kirk effect which is fully described in Wolf, S., and Tauber, R. N. "Silicon Processing for the VLSI Era," vol. 2, Lattice Press, Sunset Beach, Calif., 1990, pp. 467–8.

Figure 2J:
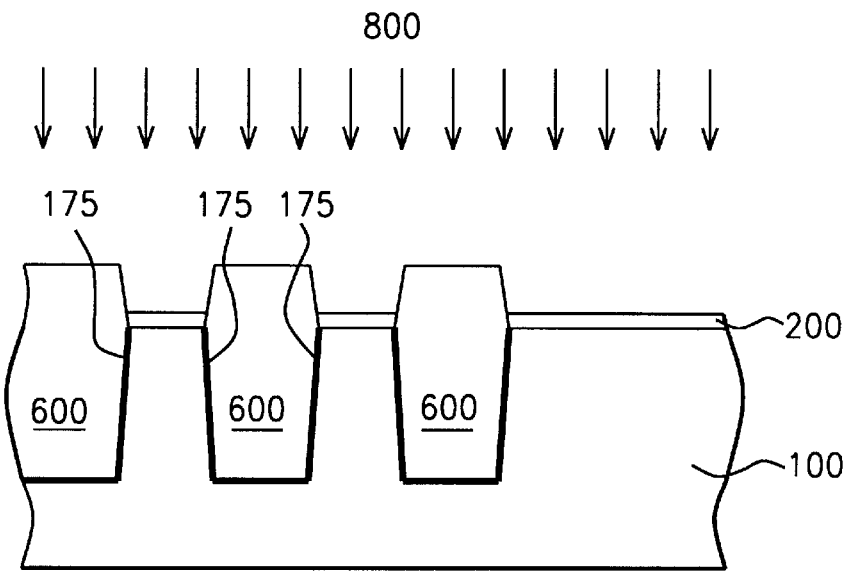
FIG. 2j shows the well implanting of the substrate while keeping the pad oxide layer according to the preferred method of the present invention.
Figure 2K:
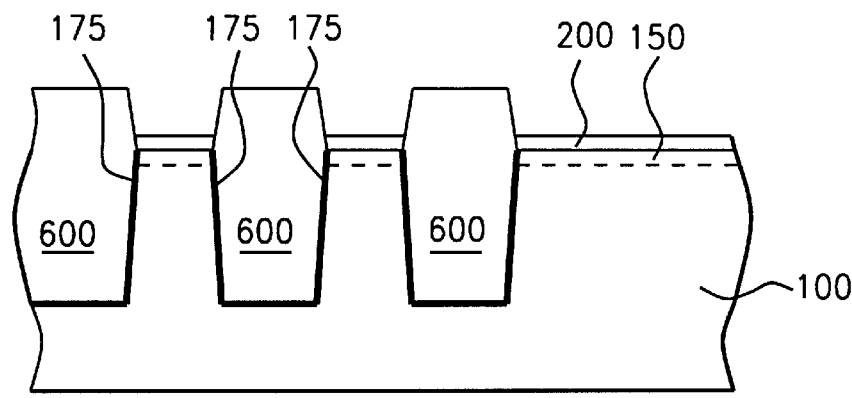
FIG. 2k shows the annealing of the substrate of FIG. 2j and forming of a low temperature oxide layer according to this invention.
Figure 2L:
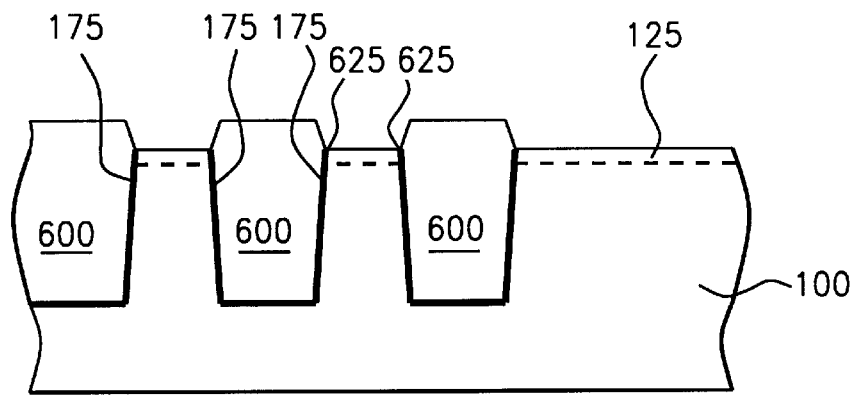
FIG. 2l shows the removal of both the pad oxide layer and the low temperature oxide layer together, and then the forming of a gate o de layer according to this invention.

The method disclosed here avoids the Kirk effect problem by not removing pad oxide layer (200) as shown in FIG. 2j, which is a main feature of the instant invention. That is, well implanting (800) is performed with the pad oxide layer performing the function of a screen oxide. Preferably, ion implanting is accomplished with boron (B) or phosphorous (P) ions at a dosage level between about $1\times10^{12}$ to $1\times10^4$ atoms/$cm^2$ and at an energy level between about 20 to 180 or between about 150 to 450 KeV. Further, as an important step, the substrate is annealed in a rapid thermal annealer (RTA) at a temperature between about 1000 to 1100° C. for between about 10 to 20 seconds, which in turn grows a thin layer of low temperature, or thermal oxide layer (150) shown in FIG. 2k. The thermal oxide layer acts as a getter for any damage that may have occurred at the silicon surface during implantation. Thus, as another key aspect of the present invention, the composite layers formed by pad oxide layer (200) and thermal oxide layer (150) are now removed together, leaving the silicon substrate surface free of any defects. The removal is accomplished by using hydrogen fluoride (HF) wet etch, and as a result there is found to be negligible, if any, notching at the shoulder of the trench. In other words, any loss of isolation oxide (600) at the corners of the trenches is very small and, therefore, any undercutting (625) such as shown in FIG. 2l is minimal with the attendant minimal Kirk effect.

As a final step in the process of forming shallow trench isolation, gate oxide layer (125) is grown thermally at a temperature between about 650 to 800° C. Alternatively, the gate oxide layer can be formed by chemical vapor deposition. The preferred thickness of the gate oxide layer shown in FIG. 2l is between about 15 to 100 Å.

While the invention has been particularly shown and described with reference to the preferred embodiments thereof, it will be understood by those skilled in the art that various changes in form and details may be made without departing from the spirit and scope of the invention.

What is claimed is:

1. A method of forming a shallow trench isolation comprising the steps of:

providing a substrate having predetermined active areas and passive regions;

forming a pad oxide layer over said substrate;

forming a nitride layer over said pad oxide layer;

forming organic BARC layer over said nitride layer;

forming a first photoresist layer over said organic BARC layer;

patterning said first photoresist layer to form a first photoresist mask defining openings for at least one shallow trench to be formed in said substrate;

etching said organic BARC layer, said nitride layer and said pad oxide layer through said openings in said first photoresist mask to expose a portion of said substrate;

etching said exposed portion of said substrate to form a shallow trench in said substrate;

removing said first photoresist mask;

forming a conformal layer of oxide on the inside walls of said shallow trench;

filling said shallow trench with isolation oxide;

forming a second photoresist layer over said substrate;

patterning said second photoresist layer to form a second photoresist mask defining reverse openings corresponding to at least one active area in said substrate;

etching said isolation oxide through said reverse openings in said second photoresist mask until said organic BARC layer over said active area is reached;

removing said second photoresist mask over said substrate;

performing chemical mechanical polishing of said isolation oxide until stopping on said organic BARC layer on said substrate;

removing said organic BARC layer and said nitride layer;

performing well implanting over said substrate using pad oxide as a screen oxide;

growing low temperature oxide to anneal the surface of said substrate;

removing said pad oxide and said low temperature oxide; and growing gate oxide layer over said substrate.

2. The method of claim 1, wherein said substrate comprises silicon.

3. The method of claim 1, wherein said forming said pad oxide layer is accomplished by thermal growth at a temperature between about 850 to 950° C.

4. The method of claim 3, wherein said pad oxide layer has a thickness between about 100 to 200 angstroms (Å).

5. The method of claim 1, wherein said forming said nitride layer is accomplished by reacting dichlorosilane ($SiCl_2H_2$) with ammonia ($NH_3$) in an LPCVD at a temperature between about 700 to 800° C.

6. The method of claim 1, wherein said nitride layer has a thickness between about 1000 to 2000 Å.

7. The method of claim 1, wherein said organic BARC layer has a thickness between about 300 to 500 Å.

8. The method of claim 1, wherein said first photoresist layer has a thickness between about 4000 to 6000 Å.

9. The method of claim 1, wherein said etching said organic BARC layer, said nitride layer and said pad oxide layer through said openings is accomplished using gases $O_2/N_2$.

10. The method of claim 1, wherein said etching said exposed portion of said substrate to form a shallow trench in said substrate is accomplished with a recipe comprising $Cl_2$ and HBr.

11. The method of claim 1, wherein said forming said conformal layer of oxide is accomplished at a temperature between about 1000 to 1100° C.

12. The method of claim 1, wherein said conformal layer of oxide has a thickness between about 100 to 350 Å.

13. The method of claim 1, wherein said isolation oxide comprises $SiO_2$ formed by employing high-density plasma (HDP) chemical vapor deposition (CVD).

14. The method of claim 1, wherein said second photoresist layer has a thickness between about 1.0 to 1.2 $\mu$m.

15. The method of claim 1, wherein said etching said isolation oxide through said reverse openings is accomplished with a recipe comprising having high oxide/SiN selectivity.

16. The method of claim 1, wherein said removing said organic BARC layer and said nitride layer is accomplished using gases $O_2/N_2$.

17. The method of claim 1, wherein said well implanting is accomplished with boron or phosphorous ions at a dosage level between about $1\times10^{12}$ to $1\times10^{14}$ atoms/cm² and energy level between about 20–180 to 15–450 KeV.

18. The method of claim 1, wherein said growing said low temperature oxide is accomplished at a temperature between about 700 to 800° C.

19. The method of claim 1, wherein said removing said pad oxide and said low temperature oxide is accomplished by wet-etching with hydrogen fluoride (HF).

20. The method of claim 1, wherein said growing said gate oxide layer is accomplished at a temperature between about 650 to 800° C.

21. The method of claim 1, wherein said gate oxide layer has a thickness between about 15 to 100 Å.

22. A method of forming a shallow trench isolation comprising:

providing a substrate having predetermined active areas and passive regions;

forming over said substrate a pad oxide layer, a nitride layer, and a organic BARC layer in the given order;

etching through said organic BARC layer, said nitride layer, said pad oxide layer, and into said substrate to form a shallow trench in said substrate;

growing an oxide lining layer on the inside walls of said shallow trench;

depositing isolation oxide in said shallow trench;

performing reverse etching of said isolation oxide over wide active regions on said substrate until organic BARC layer is reached;

performing chemical-mechanical polishing of said isolation oxide until stopping on said organic BARC layer on said substrate;

removing said organic BARC layer and nitride layer;

performing well implanting over said substrate using pad oxide as a screen oxide;

growing low temperature oxide to anneal the surface of said substrate;

removing said pad oxide and said low temperature oxide; and growing gate oxide layer over said substrate.

23. The method of claim 22, wherein said pad oxide layer has a thickness between about 100 to 200 Å.

24. The method of claim 22, wherein said nitride layer has a thickness between about 1000 to 2000 Å.

25. The method of claim 22, wherein said organic BARC layer has a thickness between about 300 to 500 Å.

26. The method of claim 22, wherein said oxide lining has a thickness between about 200 to 350 Å.

27. The method of claim 22, wherein said removing said organic BARC layer and nitride layer is accomplished using gases $O_2/N_2$.

28. The method of claim 22, wherein said performing said well implanting over said substrate using said pad oxide as a screen oxide is accomplished with boron or phosphorous ions at a dosage level between about $1\times10^{12}$ to $1\times10^{14}$ atoms/cm² and energy level between about 20–180 to 15–450 KeV.

29. The method of claim 22, wherein said growing said low temperature oxide to anneal the surface of said substrate is accomplished at a temperature between about 1000 to 1100° C.

30. The method of claim 22, wherein said low temperature oxide has a thickness between about 20 to 50 Å.

31. The method of claim 22, wherein said removing said pad oxide and said low temperature oxide is accomplished with HF wet-etch.

32. The method of claim 22, wherein said growing said gate oxide layer is accomplished at a temperature between about 700 to 900° C.

33. The method of claim 22, wherein said gate oxide layer has a thickness between about 20 to 50 Å.

* * * * *